US012671416B2

(12) United States Patent
Yamaji et al.

(10) Patent No.: US 12,671,416 B2
(45) Date of Patent: Jun. 30, 2026

(54) SUPERCONDUCTING QUANTUM CIRCUIT APPARATUS HAVING COUPLER INCLUDING AT LEAST ONE JOSEPHSON JUNCTION

(71) Applicant: NEC Corporation, Tokyo (JP)

(72) Inventors: Tomohiro Yamaji, Tokyo (JP); Ryoji Miyazaki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 735 days.

(21) Appl. No.: 18/101,917

(22) Filed: Jan. 26, 2023

(65) Prior Publication Data

US 2023/0318601 A1 Oct. 5, 2023

(30) Foreign Application Priority Data

Mar. 30, 2022 (JP) ................................. 2022-056109

(51) Int. Cl.
| | |
|---|---|
| *H03K 17/92* | (2006.01) |
| *G06N 10/20* | (2022.01) |
| *G06N 10/40* | (2022.01) |

(52) U.S. Cl.
CPC ............. *H03K 17/92* (2013.01); *G06N 10/20* (2022.01); *G06N 10/40* (2022.01)

(58) Field of Classification Search
CPC ......... H03K 17/92; G06N 10/40; G06N 10/20
See application file for complete search history.

(56) References Cited

U.S. PATENT DOCUMENTS

| | | | |
|---|---|---|---|
| 2007/0194225 A1* | 8/2007 | Zorn | G01Q 30/10 |
| | | | 250/306 |
| 2019/0044046 A1* | 2/2019 | Caudillo | G06N 10/20 |
| 2019/0044668 A1 | 2/2019 | Elsherbini et al. | |

(Continued)

FOREIGN PATENT DOCUMENTS

| | | |
|---|---|---|
| CN | 114118429 A | 3/2022 |
| JP | 2018-524795 A | 8/2018 |

(Continued)

OTHER PUBLICATIONS

Uri Vool et al., "Introduction to Quantum Electromagnetic Circuits", International Journal of Circuit Theory and Applications 45, 897-934 (2017).

(Continued)

*Primary Examiner* — Michael Jung
(74) *Attorney, Agent, or Firm* — Sughrue Mion, PLLC

(57) ABSTRACT

A superconducting quantum circuit apparatus includes first through fourth qubits; and a coupler arranged in a region surrounded by a ground plane. The coupler includes: first and second electrodes opposed to each other; and a nonlinear element including at least one Josephson junction bridged between the first electrode and the second electrode between the first and second electrode, the first electrode including first and second opposing portions extended toward the first and second qubits, the second electrode including third and fourth opposing portions extended toward third and fourth qubit, the first through fourth opposing portions having ends for capacitive coupling with the first through fourth qubits, respectively. The ends of the first through fourth opposing portions are disposed within the region surrounded by the ground plane.

12 Claims, 12 Drawing Sheets

(56) References Cited

U.S. PATENT DOCUMENTS

| | | | |
|---|---|---|---|
| 2019/0065981 A1 | 2/2019 | Chen et al. | |
| 2019/0074570 A1 | 3/2019 | Friedman | |
| 2019/0294991 A1 | 9/2019 | Filipp et al. | |
| 2019/0385673 A1 | 12/2019 | Bosman et al. | |
| 2020/0321506 A1 | 10/2020 | Kelly et al. | |
| 2020/0395405 A1* | 12/2020 | Barends ................. | H10N 69/00 |

FOREIGN PATENT DOCUMENTS

| | | | |
|---|---|---|---|
| JP | 6437607 B1 | 12/2018 | |
| JP | 6749382 B2 | 9/2020 | |
| JP | 2020-174199 A | 10/2020 | |
| JP | 2020-536397 A | 12/2020 | |
| JP | 2021-501899 A | 1/2021 | |
| JP | 2021-516389 A | 7/2021 | |
| WO | 2021/245949 A1 | 12/2021 | |

OTHER PUBLICATIONS

Japanese Office Action for JP Application No. 2022-056109, mailed on May 12, 2026 with English Translation.

* cited by examiner

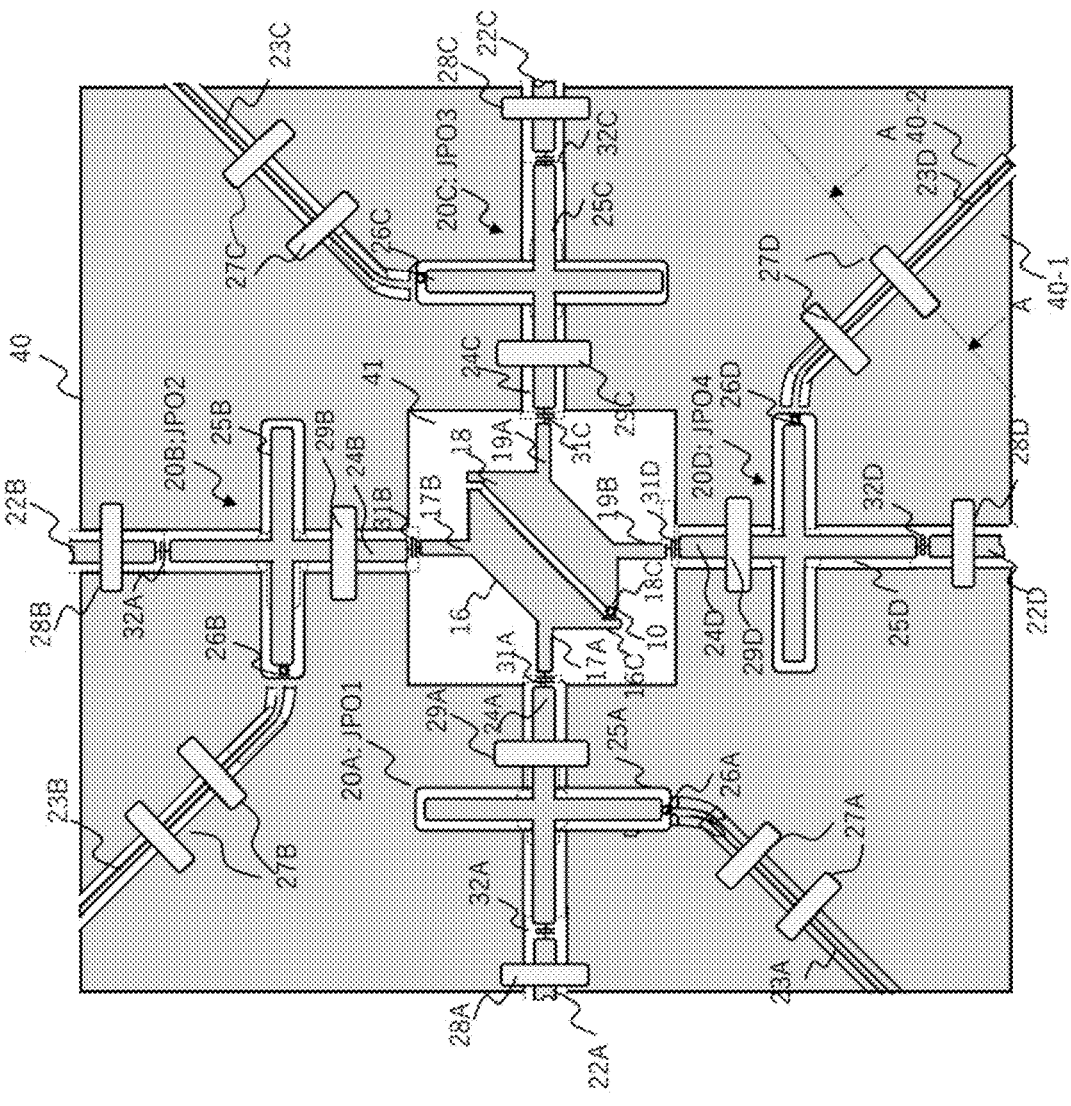
FIG. 8
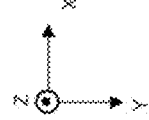

SUPERCONDUCTING QUANTUM CIRCUIT APPARATUS HAVING COUPLER INCLUDING AT LEAST ONE JOSEPHSON JUNCTION

CROSS REFERENCE TO RELATED APPLICATIONS

This application is based upon and claims the benefit of the priority of Japanese patent application No. 2022-056109, filed on Mar. 30, 2022, the disclosure of which is incorporated herein in its entirety by reference thereto. The present invention relates to a superconducting quantum circuit apparatus.

FIELD

Background

A quantum bit (qubit) including a superconducting quantum circuit, is typically configured as a planar circuit on a semiconductor substrate with a superconducting material deposited thereon. A quantum computation is performed using an inter-qubit coupling between qubits. A quantum computation under a wide variety of conditions may include switching between presence and non-presence of the inter-qubit coupling and/or strength of the coupling. Hence, regarding the inter-qubit coupling, as with a qubit, a coupler including a superconducting quantum circuit provided with a superconducting quantum interference device (SQUID) is often used. Such a coupler is configured to have a magnitude of coupling variably controlled with a magnetic flux applied to a SQUID loop which includes two Josephson junctions.

An example of this type of the coupler is illustrated in FIG. 1. FIG. 1 corresponds to FIG. 4 of Patent Literature (PTL) 1. It is noted that reference numerals are changed from those of the PTL 1. An apparatus, as illustrated in FIG. 1, includes four fixed frequency quantum circuits (qubits) 111-114, each capacitively coupled with a tunable coupler 120, which includes a SQUID in which both ends of two opposing superconducting lines are connected via two Josephson junctions to constitute a loop (SQUID loop). By changing a value of a current passing through a magnetic flux bias line (a control line) 130, which is inductively coupled with the SQUID, to change a magnetic flux penetrating through the SQUID loop, the tunable coupler 120 functions as a frequency tunable coupler.

CITATION LIST

PTL 1: Japanese Patent Kokai Publication No. 2021-516389

NPL1: Uri Vool et al., "Introduction to Quantum Electromagnetic Circuits", International Journal of Circuit Theory and Applications 45, 897-934 (2017)

SUMMARY

It is an object of the present disclosure to provide a superconducting quantum circuit apparatus with a coupler suited to suppress an effect of a floating capacitance on a strength of a four-body interaction to increase the strength of the four-body interaction.

According to the present disclosure, a superconducting quantum circuit apparatus includes first through fourth qubits; and a coupler arranged in a region surrounded by a ground plane, the coupler disposed spaced apart from the ground plane. The coupler includes: a first electrode and a second electrode arranged opposed to each other; and a nonlinear element including at least one Josephson junction bridged between the first electrode and the second electrode. The first electrode includes first and second opposing portions extended toward the first and second qubits, respectively, ends of the first and second opposing portions being opposed to ends of coupler connection portions of the first and second qubits, for capacitive coupling therewith, respectively. The second electrode includes third and fourth opposing portions extended toward third and fourth qubit, respectively, ends of the third and fourth opposing portions being opposed to ends of coupler connection portions of the third and fourth qubits, for capacitive coupling therewith, respectively. The ends of the first and second opposing portions and the ends of the third and fourth opposing portions are disposed within the region surrounded by the ground plane.

According to the present disclosure, it is possible to realize a superconducting quantum circuit apparatus having a suitable configuration for suppressing an effect of a floating capacitance on a strength of a four-body interaction to increase the strength of the four-body interaction in a coupler. Still other features and advantages of the present invention will become readily apparent to those skilled in this art from the following detailed description in conjunction with the accompanying drawings where only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 8 is a diagram illustrating one example of the example embodiment.

DETAILED DESCRIPTION

Figure 1:
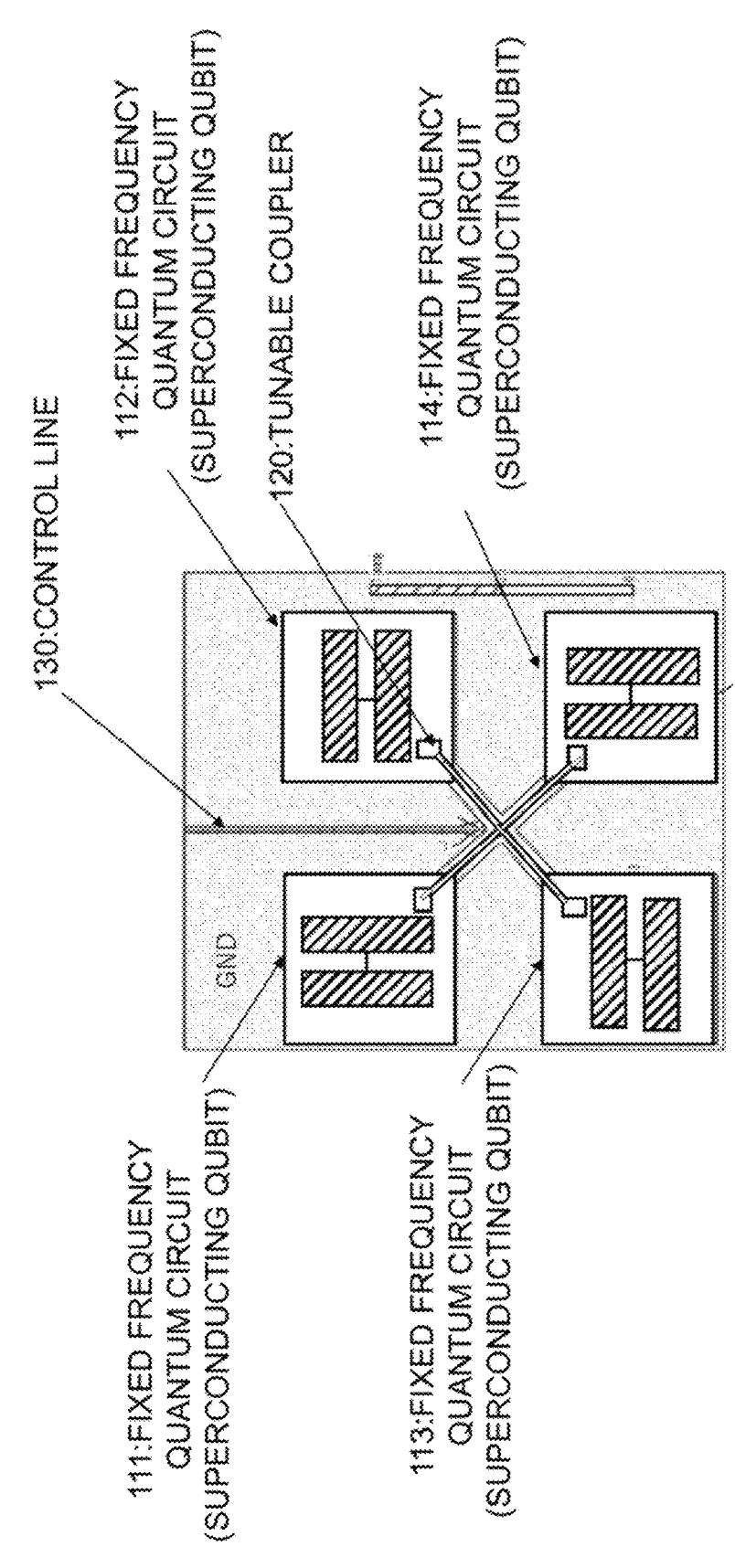
FIG. 1 is a diagram illustrating an example of a configuration of a related technology.

In FIG. 1. the tunable coupler 120 is X-shaped and has a waveguide (coplanar waveguide) provided with ground planes (GNDs) on both sides thereof, extended to a coupling location with each of the qubits 111-114. A floating capacitance $C_s$ (stray capacitance) not shown, which is a capacitance between the ground plane and the tunable coupler 120 that is capacitively coupled with an electrode of the qubit, is large such that it is difficult or impossible to increase a coupling strength (magnitude of a coupling constant) of four four-body interaction couplers (This issue is discussed in more detail below). The above issue is one example, but according to the present disclosure, it is possible to realize a superconducting quantum circuit apparatus having a suitable configuration for suppressing an effect of a floating capacitance on a strength of a four-body interaction to increase the strength of the four-body interaction in a coupler.

Figure 2:
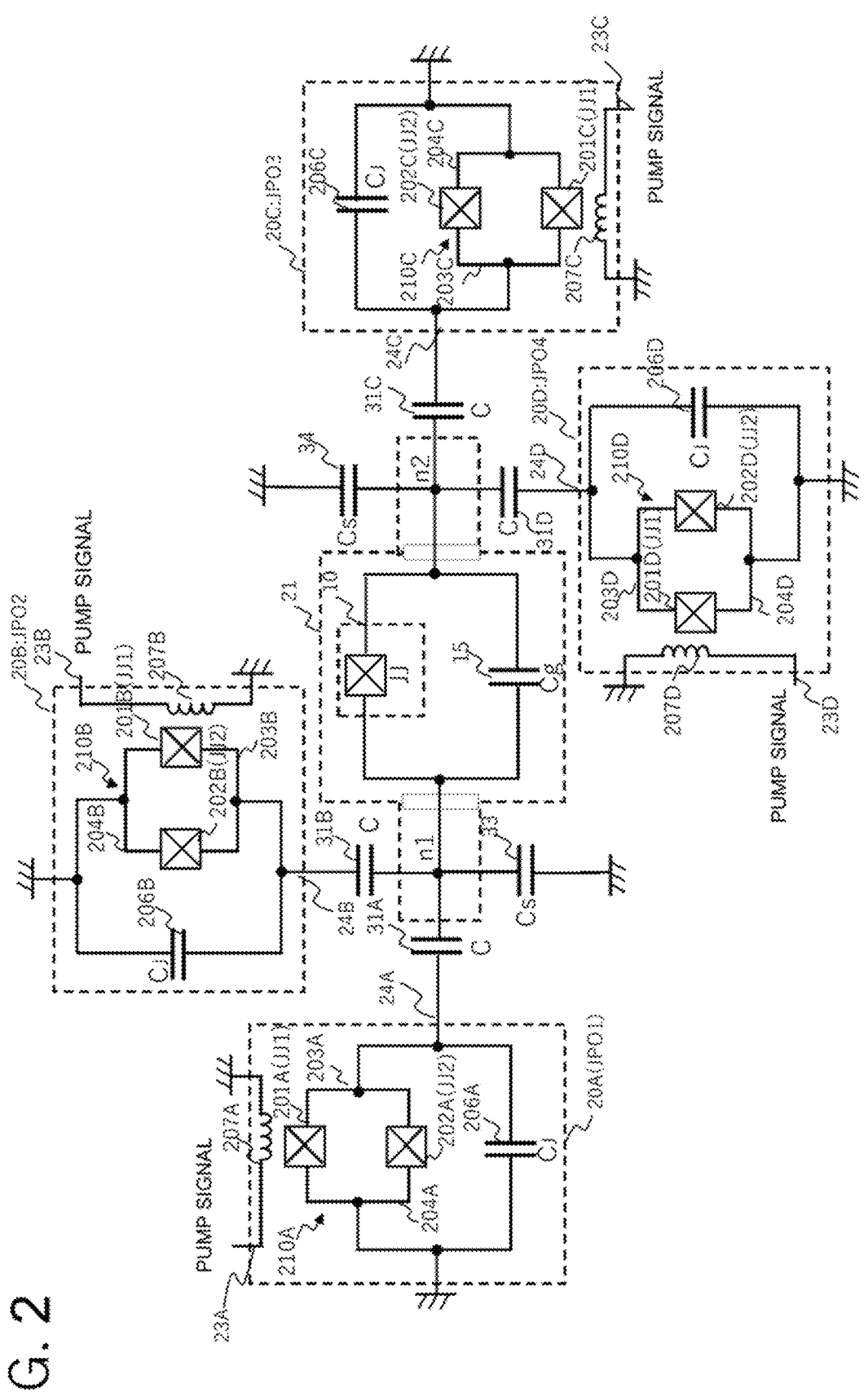
FIG. 2 is a diagram illustrating a circuit of an example embodiment.

Example Embodiments of the present disclosure will be described with reference to the drawings. FIG. 2 illustrates a system in which a Josephson Parametric Oscillator (JPO) is used as a qubit and four JPO1 (20A) through JPO4 (20D) interact via a coupler 21. In FIG. 2, in each JPO, a connection portion to connect to a readout circuit is omitted.

Referring to FIG. 2, the system is provided with the four JPO1 (20A) through JPO4 (20D) and the coupler 21. The JPO1 (20A) through JPO4 (20D) are capacitively coupled with the coupler 21 via coupling capacitors 31A through 31D, respectively. In the following example embodiments, for each JPO, a lumped element type circuit is used. However, a distribution element type circuit may, as a matter of course, be used for each JPO.

The coupler 21 is provided with a nonlinear element 10 including at least one of a Josephson junction (JJ) and a capacitor 15 connected in parallel to the nonlinear element 10. The nonlinear element 10 may be configured to include a SQUID which includes a first superconducting line, a first Josephson junction, a second superconducting line and a second Josephson junction, connected in a loop.

The JPO1 (20A) through JPO4 (20D) are provided with SQUIDs (loops) 210A through 210D, magnetic field generators 207A through 207D and capacitors 206A through 206D, respectively. In the SQUIDs (loops) 210A through 210D, first superconducting portions 203A through 203D, first Josephson junctions 201A through 201D, second superconducting portions 204A through 204D, and second Josephson junctions 202A through 202D are connected, respectively, in a loop. The magnetic field generators 207A through 207D are configured to apply direct currents and pump signals which are supplied from signal generators (current control parts) (not shown) to control lines 23A through 23D to generate magnetic fluxes penetrating through the SQUID loops 210A through 210D, respectively. The capacitors 206A through 206D are connected between the first superconducting portions 203A through 203D and the second superconducting portions 204A through 204D, respectively. Each of the second superconducting portions 204A through 204D is connected to ground. The first superconducting portion 203A of the JPO1 (20A) is connected to one end of a first coupler connection portion 24A, another end of which is connected (capacitively connected) to one end of the coupler 21 via a coupling capacitor 31A. The first superconducting portion 203B of the JPO2 (20B) is connected to one end of a second coupler connection portion 24B, another end of which is connected (capacitively connected) to the one end of the coupler 21 via a coupling capacitor 31B. Likewise, the first superconducting portion 203C of the JPO3 (20C) is connected to one end of a third coupler connection portion 24C, another end of which is connected (capacitively connected) to another end of the coupler 21 via a coupling capacitor 31C, and the first superconducting portion 203D of the JPO4 (20D) is connected to one end of a fourth coupler connection portion 24D, another end of which is connected (capacitively connected) to the another end of the coupler 21 via a coupling capacitor 31D. Pump frequencies supplied to the control lines 23A through 23D of the JPO1 (20A) through JPO4 (20D), respectively, are close to twice resonance angular frequencies thereof. In each of the JPO1 (20A) through JPO4 (20D), there is a certain threshold for strength of the pump signal, beyond which each of the JPO1 (20A) through JPO4 (20D) oscillates and outputs a signal at the resonant frequency, even with no input signal present. This is called parametric oscillation.

In FIG. 2, $C_J$ is a capacitance value of each of the capacitors 206A through 206D of the JPO1 (20A) through JPO4 (20D), $C_g$ is a capacitance value of the capacitor 15 in the coupler 21, and C is a capacitance value of each of the coupling capacitor 31A through 31D.

A capacitance 33 connected between a connection node n1 and ground represents a floating capacitance with a capacitance value $C_s$. The connection node n1 is a node at which one end of the coupler 21 and the coupling capacitors 31A and 31B are connected. A capacitance 34 connected between a connection node n2 and ground represents a floating capacitance with a capacitance value $C_s$. The connection node n2 is a node at which another end of the coupler 21 and the coupling capacitors 31C and 31D are connected.

Figure 3:
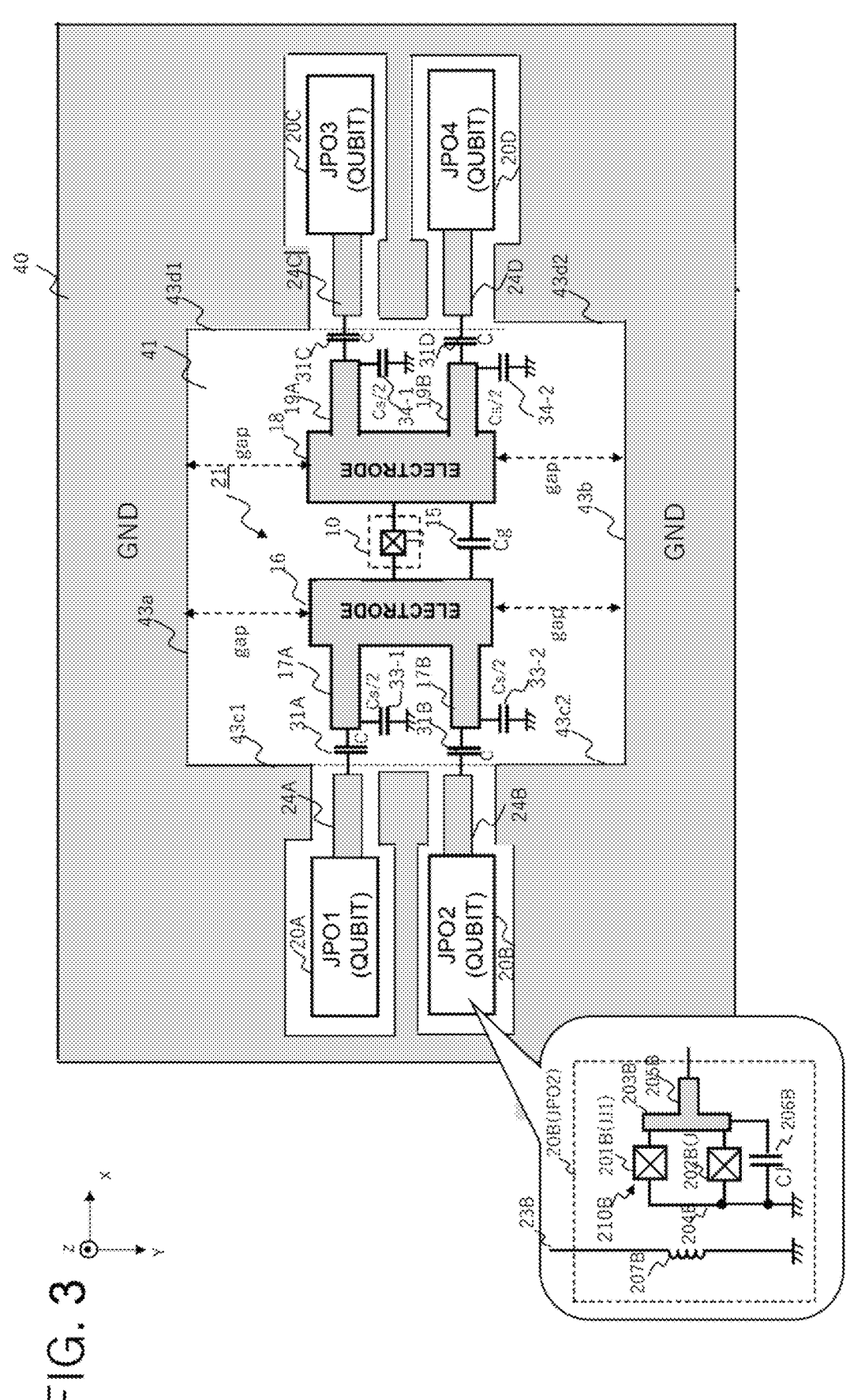
FIG. 3 is a diagram schematically illustrating the example embodiment.

FIG. 3 is a diagram schematically illustrates an example of a configuration of the coupler 21 (wiring patterns formed on a substrate) in a case where JPO1 (20A) through JPO4 (20D) are configured as a lumped element type, as one example of the configuration illustrated in FIG. 2. In FIG. 3, each JPO of the JPO1 (20A) through JPO4 (20D) is configured as illustrated in FIG. 2. In FIG. 3, for the sake of simplicity of the drawing, only a configuration of the JPO2 (20B) is illustrated in a callout. Also, in FIG. 3, a connection portion (waveguide) connecting to a readout circuit provided for each of the JPO1 (20A) through JPO4 (20D) are omitted.

The coupler 21 is arranged in a region 41 surrounded by a ground plane (planar ground pattern: GND) 40 on a substrate and spaced apart from edges (43a, 43b, 43c1, 43c2, 43d1, 43d2) of the ground plane 40. In FIG. 3, in the region 41, there is no ground wiring pattern, and a surface of the substrate is exposed in a gap region between the ground plane 40 and the coupler 21.

The coupler 21 includes a nonlinear element 10, first and second electrodes 16 and 18 made of a superconducting material, and a capacitor ($C_g$) 15. The nonlinear element 10 includes at least one Josephson junction (JJ). The electrode 16 is connected to one end of the nonlinear element 10, and the electrode 18 is connected to another end of the nonlinear element 10. The capacitor 15 is shunt-connected (connected in parallel) with the nonlinear element 10. The first electrode 16 is provided with first and second opposing portions 17A and 17B made of a superconducting material. The first and second opposing portions 17A and 17B are extended (protruded) from the first electrode 16 towards the JPO1 (20A) and JPO2 (20B), respectively. The second electrode 18 is provided with third and fourth opposing portions 19A and 19B made of a superconducting material. The third and fourth opposing portions 19A and 19B are extended (protruded) from the second electrode 18 towards the JPO3 (20C) and JPO4 (20D), respectively. In the coupler 21 of FIG. 3, the capacitor ($C_g$) 15, which is shunt-connected (connected in parallel) with the nonlinear element 10, corresponds to a capacitance between the first electrode 16 and the second electrode 18 arranged opposing each other. In FIG. 3, only for the sake of simplicity of the drawing, two JPOs (JPO1 and JPO2) are illustrated on a left side of the coupler 21 and two other JPOs (JPO3 and JPO4) are illustrated on a right side of the coupler 21. However, for example, the JPO1 could be arranged on the left side of the coupler 21, the JPO2 on a top side of the coupler 21, the JPO3 on the right side of the coupler 21 and the JPO4 on a bottom side of the coupler 21. Alternatively, the four JPOs may be arranged in first to fourth quadrants with the coupler 21 placed at a center as an origin.

The JPO1 (20A) through JPO4 (20D) are configured as coplanar waveguide resonators terminated to ground via SQUIDs 210A through 210D, respectively. A parametric oscillation is induced in the waveguide resonator when a magnetic flux penetrating through each of the SQUID loops 210A through 210D is modulated at a frequency approximately twice the resonance frequency by means of pump signals (microwave) supplied from control lines (23A through 23D in FIG. 8), which are not shown in FIG. 3.

In the JPO2 (20B), a second coupler connection portion 24B has one end capacitively coupled with an end of the second opposing portion 17B extending from the first electrode 16 of the coupler 21. The second coupler connection portion 24B is a conductor 205B (a waveguide made of a superconducting material) having another end connected to a first superconducting portion 203B of the SQUID loop 210B. A capacitance value C of the coupling capacitor 31B is a value of a capacitance component between the opposing ends of the second coupler connection portion 24B and the second opposing portion 17B.

In the JPO1 (20A), as with the JPO2 (20B), a first coupler connection portion 24A has one end capacitively coupled with an end of the first opposing portion 17A extending from the first electrode 16 of the coupler 21. The first coupler connection portion 24A is a conductor (a waveguide made of a superconducting material) having another end connected to a first superconducting portion 203B of the SQUID loop 210A. A capacitance value C of a coupling capacitor 31A is a value of a capacitance component between the opposing ends of the first coupler connection portion 24A and the first opposing portion 17A. Similarly, in the JPO3 (20C), a third coupler connection portion 24C has one end capacitively coupled with an end of the third opposing portion 19A extending from the second electrode 18 of the coupler 21, and in the JPO4 (20D), a fourth coupler connection portion 24D has one end capacitively coupled with an end of the fourth opposing portion 19B extending from the second electrode 18 of the coupler 21. The third coupler connection portion 24C is a conductor (a waveguide made of a superconducting material) having another end connected to a first superconducting portion 203C of the SQUID loop 210C, and the fourth coupler connection portion 24D is a conductor (a waveguide made of a superconducting material) having another end connected to a first superconducting portion 203D of the SQUID loop 210D. A capacitance value C of a coupling capacitor 31C is a value of a capacitance component between the opposing ends of the third coupler connection portion 24C and the third opposing portion 19A, and a capacitance value C of a coupling capacitor 31D is a value of a capacitance component between the opposing ends of the fourth coupler connection portion 24D and the fourth opposing portion 19B. Each of the first through fourth coupler connection portions 24A through 24D is configured with a coplanar waveguide (CPW) having both sides of longitudinal direction thereof sandwiched between ground planes via gaps.

In FIG. 3, a reference numeral 33-1 represents a floating capacitance between the first opposing portion 17A of the first electrode 16 and ground, a reference numeral 33-2 represents a floating capacitance between the second opposing portion 17B of the first electrode and ground, a reference numeral 34-1 represents a floating capacitance between the third opposing portion 19A of the second electrode 18 and ground and a reference numeral 34-2 represents a floating capacitance between the fourth opposing portion 19B of the second electrode 18 and ground. A parallel combined capacitance value of the floating capacitances 33-1 and 33-2 is equal to a value $C_s$ of a floating capacitance 33 at node n1 (one end of the coupler 21) in FIG. 2. The capacitance value of each of the floating capacitances 33-1 and 33-2 is assumed to be half of $C_s$ (Cs/2). A parallel combined capacitance value of the floating capacitances 34-1 and 34-2 is equal to a value $C_s$ of a floating capacitance 34 at node n2 (another end of the coupler 21) in FIG. 2. The capacitance value of each of the floating capacitances 34-1 and 33-2 is assumed to be half of $C_s$ (Cs/2).

The respective ends of the first and second opposing portions 17A and 17B (open end side ends) and the respective ends of the third and fourth opposing portions 19A and 19B (open end side ends) of the coupler 21 are disposed within the region 41 defined by the edges 43a, 43b, 43c1, 43d1, 43c2, and 43d2 of the ground plane 40. The edges 43a and 43b, the edges 43c1 and 43d1, and the edges 43c2 and 43d2 are spaced apart and opposed each other, respectively. In FIG. 3, the edges 43a, 43b, 43c1, 43d1, 43c2, and 43d2 of the ground plane 40 form a quadrilateral having straight edges as the edges of the region 41. However, the edges of the region 41 are, as a matter of course, not limited to a quadrilateral shape. The edges 43a, 43b, 43c1, 43d1, 43c2 and 43d2 of the ground plane 40 are not limited to straight lines but may include uneven or curved lines.

In FIG. 3, a gap (capacitively coupled portion) between the opposing ends of the first opposing portion 17A of the first electrode 16 of the coupler 21 and the first coupler connection portion 24A of the JPO1 (20A), a gap (capacitively coupling portion) between the opposing ends of the second opposing portion 17B of the first electrode 16 of the coupler 21 and the second coupler connection portion 24B of the JPO2 (20B), a gap (capacitively coupling portion) between the opposing ends of the third opposing portion 19A of the second electrode 18 of the coupler 21 and the third coupler connection portion 24C of the JPO3 (20C), and a gap (capacitively coupling portion) between the opposing ends of the fourth opposing portion 19B of the second electrode 18 of the coupler 21 and the fourth coupler connection portion 24D of the JPO4 (20D) are all disposed within the region 41 defined by the edges 43a, 43b, 43c1, 43d1, 43c2, and 43d2 of the ground plane 40, where the edges 43a and 43b, the edges 43c1 and 43d1, and the edges 43c2 and 43d2 are spaced apart and opposed each other, respectively.

A gap between the first electrode 16 of the coupler 21 and the edge 43a of the ground plane 40 and a gap between the first electrode 16 of the coupler 21 and the edge 43b of the ground plane 40 may be of a size almost on the order of a size of the first electrode 16 (including from an extent of one several-th to several times).

A gap between the second electrode 18 of the coupler 21 and the edge 43a of the ground plane 40 and a gap between the second electrode 18 of the coupler 21 and the edge 43b of the ground plane 40 may be of a size almost on the order of size of the second electrode 16 (including from an extent of one several-th to several times). In FIG. 3, a ratio of each size of the gaps (gap widths) between the first and second electrodes 16 and 18 of the coupler 21 and the ground plane 40 and each size of the first and second electrodes 16 and 18 is schematically illustrated as an example for illustration purposes only and is not intended to exclude other variations.

When a floating capacitance Cs/2 between the first and second electrodes 16 and 18 of the coupler 21 and ground (i.e., between each end of the first and second opposing portions 17A and 17B and ground, and between each end of the third and fourth opposing portions 19A and 19B and ground) is reduced, a ratio of the floating capacitance Cs/2 in a total capacitance obtained by adding a coupling capacitance C and the floating capacitance Cs/2 to self-capacitance Cg of the coupler 21, is reduced, where the ratio of the floating capacitance Cs/2 to the total capacitance corresponds to a contribution ratio of the floating capacitance Cs/2 to a coupling strength in a four-body interaction. The reduction of the contribution ratio of the floating capacitance Cs/2 enables to increase the coupling strength in the four-body interaction.

Figure 4:
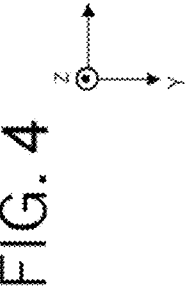
FIG. 4 is a diagram schematically illustrating a variation of the example embodiment.

In FIG. 3, the end of the first coupler connection portion 24A of the JPO1 (20A), the end of the second coupler connection portion 24B of the JPO2 (20B), the end of the third coupler connection portion 24C of the JPO3 (20C), and the end of the fourth coupler connection portion 24D of the JPO4 (20D) do not protrude into the region 41 surrounded by the edges 43a, 43b, 32c1, 43c2, 43d1, and 43d2 of the ground plane 40, wherein the edges 43a and 43b, the edges 43c1 and 43d1, and the edges 43c2 and 43d2 are spaced apart and opposed each other, respectively. That is, the ends of the first through fourth coupler connection portions 24A through 24D are each located at a position not reaching but close to the boundary (broken line) defined by the edges 43c1 and 43c2, or the edges 43d1 and 43d2 of the region 41 surrounded by the ground plane 40. The ends of the first through fourth coupler connection portions 24A through 24D may be located at positions on the boundary (broken line) of the region 41 surrounded by the ground plane. In FIG. 4, the ends of the first and second coupler connection portions 24A and 24B and the ends of the third and fourth coupler connection portions 24C and 24D protrude into the region 41. This configuration allows to increase a gap size (gap width) between each of the first and second electrodes 16 and 18 of the coupler 21 and the ground plane 40, while maintaining a magnitude of the capacitance value C of each of the coupling capacitors 31A through 31D between each of the JPO1 (20A) through JPO4 (20D) and the coupler 21, which enables to further reduce a floating capacitance Cs between each of the first and second electrodes 16 and 18 of the coupler 21 and ground.

Figure 5:
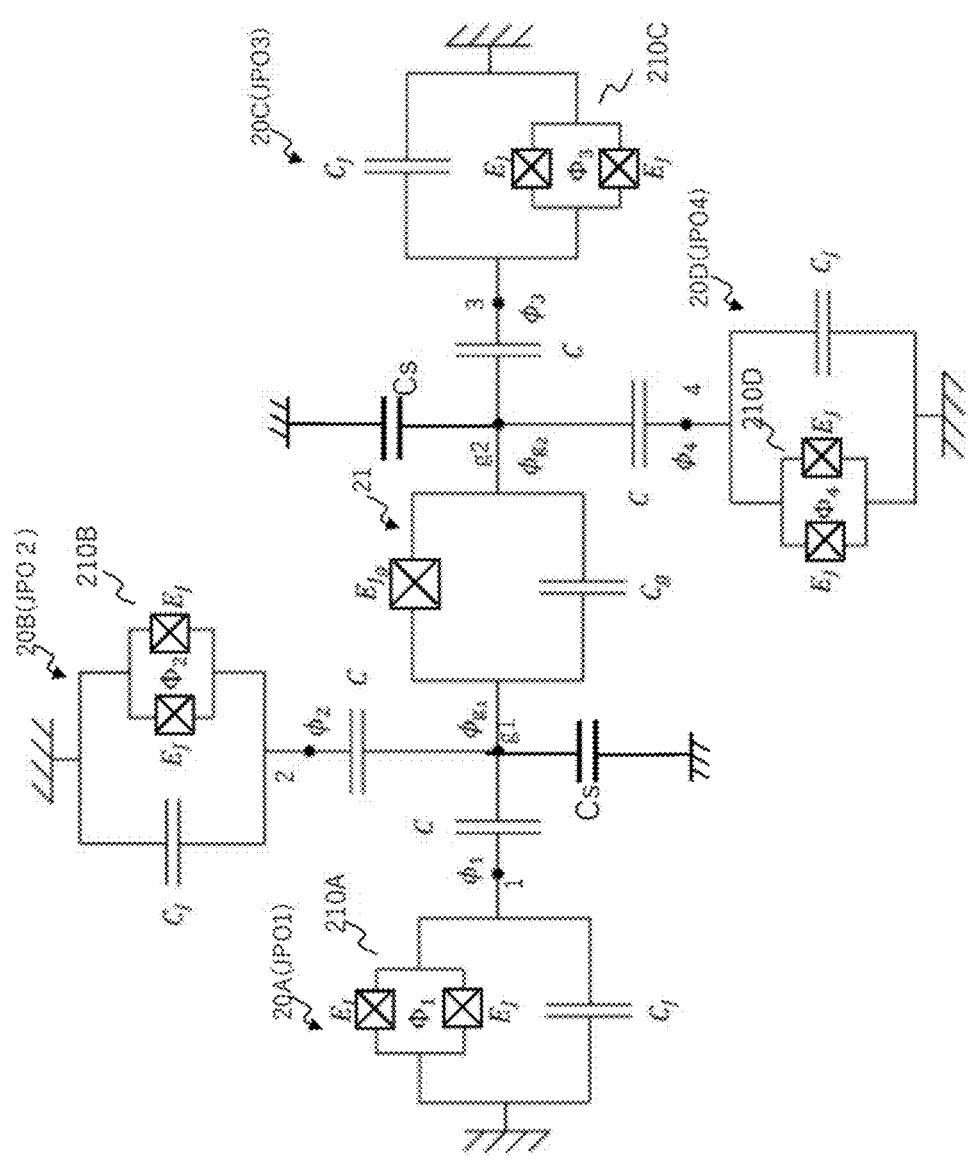
FIG. 5 is a diagram illustrating an analysis of the example embodiment.

FIG. 5 illustrates a four-body interaction of the four JPO1 (20A) through JPO4 (20D) described with reference to FIG. 2 through FIG. 4. FIG. 5 corresponds to a circuit diagram of FIG. 2. The magnetic field generator 207A through 207D are not shown in FIG. 5. In FIG. 5, a Josephson junction is indicated by a symbol with an X surrounded by a square. Each of $\Phi_1$ through $\Phi_4$ in the SQUID loops 210A through 210D of the JPO1 (20A) through JPO4 (20D) represents a magnetic flux that penetrates through a corresponding SQUID loop. $E_J$ attached to each of two Josephson junctions in the SQUID loops 210A through 210D of the JPO1 through JPO4 represents a Josephson energy.

$$E_J=(\hbar/2e)Ic \qquad (1)$$

where hbar=h/(2π), h is Planck's constant, e is the electric elementary charge, and Ic is a critical current.

$E_{J_g}$ represents a Josephson energy of a Josephson junction in the coupler 21.

Magnetic fluxes $\phi_1$ to $\phi_4$, $\phi_{g1}$ and $\phi_{g2}$ are assigned to each node 1 through 4, g1 and g2. (as for fluxes to be assigned to each node, see, for example, NPL 1). For a circuit illustrated in FIG. 5, according to a standard method disclosed in NPL 1, etc., a classical Hamiltonian is quantized and by performing further operations such as a unitary transformation and a rotating wave approximation, a Hamiltonian $H'_{total}$ is obtained. Hamiltonian $H'_{total}$ focused on a four-body interaction term is given as the following equation (2).

$$H'_{total} = \sum_{i=1}^{4} H'_{JPO,i} - g^{(4)}\left(a_1^\dagger a_2^\dagger a_3 a_4 + a_1 a_2 a_3^\dagger a_4^\dagger + \sum_{i<j} a_i^\dagger a_i a_j^\dagger a_j\right) + H'_{coupler} \qquad (2)$$

In the equation (2), $H'_{JPO,i}$ (i=1, 2, 3, 4) is a Hamiltonians of an individual one of the JPO1 (20A) through JPO4 (20D).

$H'_{coupler}$ is a Hamiltonian of the coupler 21.

$a^+_k$ and $a_k$ (k=1, 2, 3, 4) are creation operators and annihilation operators of bosons, respectively, corresponding to an individual one of the JPO1 (20A) through JPO4 (20D).

$a^+_{g-}$ and $a_{g-}$ are a creation operator and an annihilation operator of boson, respectively, corresponding to the coupler 21.

In the equation (2), $g^{(4)}$ is a coefficient (coupling constant) of a four-body interaction and is expressed by the following equation (3), using circuit parameters (e.g., a capacitance $C_g$ of the coupler 21, a coupling capacitance C, and a floating capacitance $C_s$), and resonance angular frequencies of each JPO and the coupler 21.

$$g^{(4)} = \frac{(\omega\omega_-)^2}{[4(\omega-\omega_-)]^4} \frac{C^4}{C_J^2\left(C_g+C+\frac{C_s}{2}\right)^3} e^2 \qquad (3)$$

In the equation (3), ω is a resonance angular frequency of each JPO and is given by the following equation (4).

$$\omega=\sqrt{8E_cE_J} \qquad (4)$$

$\omega_-$ is a resonance angular frequency of the coupler 21 and is given by the following equation (5).

$$\omega_-=\sqrt{8E'_{cg}E_{Jg}} \qquad (5)$$

In the equation (3), e is the electric elementary charge.

In the equation (4), Ec is a charged energy of the capacitances $C_J$ of each JPO and is given by the following equation (6).

$$E_C = \frac{e^2}{2C_J} \qquad (6)$$

$E_J$ is a Josephson energy of each JPO.

In the equation (5), $E'c_g$ is a charged energy of a combined capacitance of $C_g+C+C_s/2$ and is given by the following equation (7).

$$E'_{Cg} = \frac{e^2}{2\left(C_g + C + \frac{C_s}{2}\right)} \tag{7}$$

$E_{Jg}$ is a Josephson energy of the Josephson junction in the coupler 21.

As given by the equation (3), a denominator of the coefficient (coupling constant) of the four-body interaction $g^{(4)}$ includes the floating capacitance $C_s$ as a term: $C_g+C+C_s/2$. The smaller a value of the floating capacitance $C_s$, the more a contribution ratio of $C_g+C$ to the coefficient (coupling constant) of the four-body interaction $g^{(4)}$ increases. The larger the value of the floating capacitance $C_s$, the smaller $g^{(4)}$ becomes.

From the equations (5) and (7), a resonance angular frequency $\omega_-$ of the coupler 21 corresponding to $a_{g_-}$ (an annihilation operator of boson of the coupler 21) also depends on the floating capacitance $C_s$.

Figure 6:
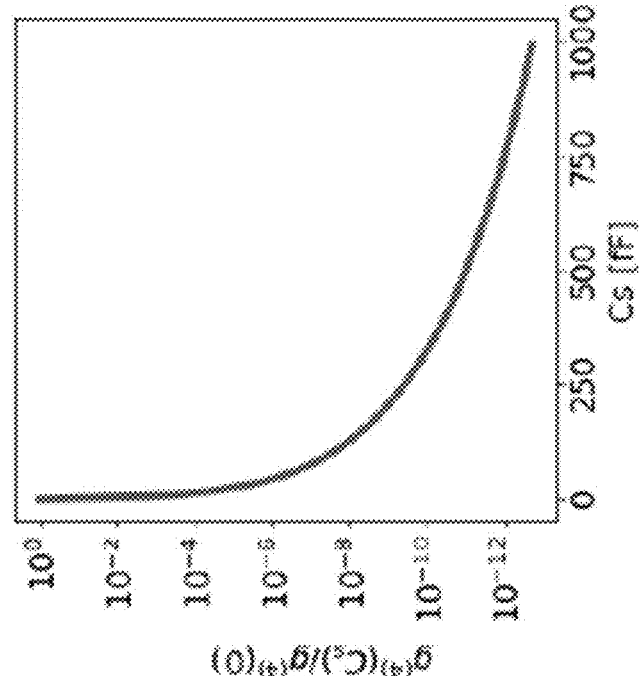
FIG. 6 is a diagram illustrating characteristics of a strength of a four-body interaction of the example embodiment.

The following describes an effect of the floating capacitance $C_s$ on a circuit. FIG. 6 shows an example of a ratio of a coefficient (coupling constant) of the four-body interaction $g^{(4)}$ in a case when the floating capacitance $C_s$ is present to that in a case when the floating capacitance $C_s$ is not present $(g^{(4)}(Cs)/g^{(4)}(0))$ (vertical axis), plotted against the value of the floating capacitance Cs (horizontal axis).

The graph shows a ratio: $g^{(4)}(Cs)/g^{(4)}(0)$, where $g^{(4)}(Cs)$ is $g^{(4)}$ with the floating capacitance $C_s$, and $g^{(4)}(0)$ is $g^{(4)}$ without the floating capacitance $C_s$, under the following parameter settings, as an example of a concrete circuit parameter setting in FIG. 5:

Resonance angular frequency $\omega$ of each JPO is set to $\omega/2\pi=10$ GHz (gigahertz);

Capacitance of each JPO $C_J=1000$ fF (femtofarad);

Capacitance of the capacitor 15 in the coupler 21 $C_g=200$ fF; and

Each coupling capacitance C=1 fF.

$g^{(4)}(Cs)$ and $g^{(4)}(0)$ are given by the following equations (8) and (9), respectively.

$$g^{(4)}(C_s) = \frac{(\omega\omega_-(C_s))^2}{[4(\omega - \omega_-(C_s))]^4} \times \frac{C^4}{C_J^2\left(C_g + C + \frac{C_s}{2}\right)^3}e^2 \tag{8}$$

$$g^{(4)} = \frac{(\omega\omega_-(0))^2}{[4(\omega - \omega_-(0))]^4} \times \frac{C^4}{C_J^2(C_g + C)^3}e^2 \tag{9}$$

From the equations (8) and (9), we have the following equation (10), as the ratio: $g^{(4)}(Cs)/g^{(4)}(0)$.

$$\frac{g^{(4)}(C_s)}{g^{(4)}(0)} = \frac{(\omega\omega_-(C_s))^2[4(\omega - \omega_-(0))]^4}{(\omega\omega_-(0))^2[4(\omega - \omega_-(C_s))]^4} \times \frac{(C_g + C)^3}{\left(C_g + C + \frac{C_s}{2}\right)^3} \tag{10}$$

In the equations (8) through (10), $$\omega_-(C_s) = e\sqrt{\frac{8E_{Jg}}{2\left(C_g + C + \frac{C_s}{2}\right)}} \tag{11}$$

$$\omega_-(0) = e\sqrt{\frac{8E_{Jg}}{2(C_g + C)}} \tag{12}$$

The resonant frequency $\omega_-/2\pi$ of the coupler 21 is 9.98 GHz ($\omega_-/2\pi=9.98$ GHz) without the floating capacitance $C_s$. The resonant frequency $\omega_-/2\pi$ of the coupler 21 varies in accordance with the floating capacitance $C_s$.

In the above settings, in case when the floating capacitance $C_s$ is not present (Cs=0), $g^{(4)}(0)$ is given by.

$$g^{(4)}(0)=2\pi\times h\text{bar}\times 1.16 \text{ MHz (megahertz)} \tag{13}$$

As shown in FIG. 6, $g^{(4)}$ decreases rapidly in accordance with the value of floating capacitance $C_s$. One of reasons for this decrease is that the resonance angular frequency $\omega_-$ of the coupler 21 changes due to an effect of the floating capacitance $C_s$, which increases the denominator of $g^{(4)}$ [equation (3)].

Figure 7:
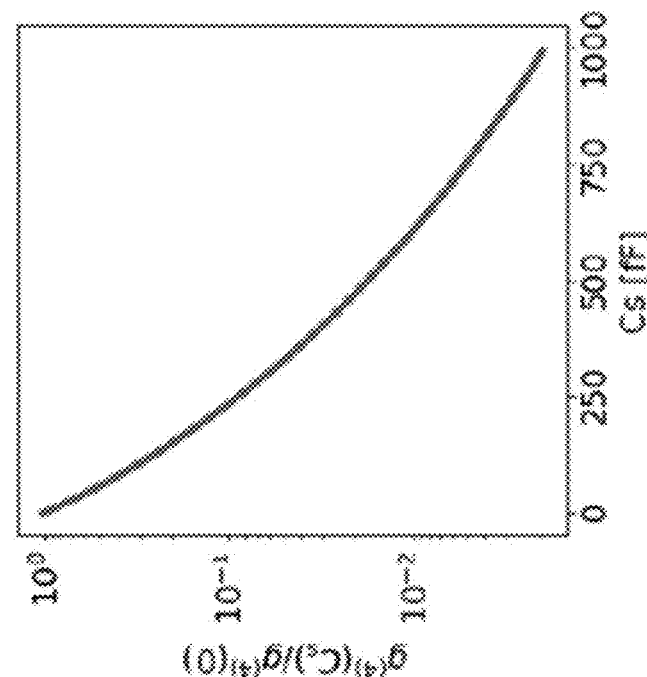
FIG. 7 is a diagram illustrating characteristics of a strength of a four-body interaction of the example embodiment.

Even when $\omega_-$ would be fixed to 9.98 GHz of the above setting in some way or another, $g^{(4)}$ still decreases in accordance with the value of the floating capacitance $C_s$ (see FIG. 7). Therefore, when there are floating capacitances $C_s$ at both ends of the coupler 21, the larger the value of the floating capacitance $C_s$, the smaller the coefficient (coupling constant) of the four-body interaction $g^{(4)}$.

FIG. 7 illustrates the ratio $g^{(4)}(Cs)/g^{(4)}(0)$, when the following settings are used in FIG. 5.

$\omega=10$ GHz, $\omega_-=9.98$ GHz, $C_J=1000$ fF, $C_g=200$ fF, and C=1 fF.

The difference between FIG. 7 and FIG. 6 is that in FIG. 7, the resonance angular frequency $\omega_-$ of the coupler 21 is fixed at 9.98 GHz. In this case, as shown in FIG. 7, the graph of $g^{(4)}(Cs)/g^{(4)}(0)$ does not show a rapid decrease as in FIG. 6.

Next, a configuration example of the example embodiment will be described. FIG. 8 illustrates a non-limiting example of the above example embodiment and schematically illustrates a non-limiting example of a wiring pattern (planar circuit) of a superconducting quantum circuit fabricated on a substrate such as silicon.

A planar configuration of a coupler that couples four qubits by a four-body interaction is illustrated in FIG. 8, in which four qubits are configured respectively by four JPO1 (20A) through JPO4 (20D) of a lumped element type.

Each of the JPO1 (20A) through JPO4 (20D) of a lumped element type includes a resonator provided with a linear (not non-linear) inductance, a capacitance component and a non-linear element including a Josephson junction.

The coupler 21, the JPO1 (20A) through JPO4 (20D), and the ground plane 40 are implemented as wiring patterns of a wiring layer formed by a superconducting material on a substrate. Silicon (Si) is used as the substrate, but an electronic material such as sapphire or a compound semiconductor material (group IV, group III-V and group II-VI) may be used. The substrate is preferably a single crystal but may be a polycrystalline or an amorphous. As a material of the line (wiring), Nb (niobium) or Al (aluminum) may be used, for example, though not limited thereto. Any metal that becomes superconductive at a cryogenic temperature may be used, such as niobium nitride, indium (In), lead (Pb), tin (Sn), rhenium (Re), palladium (Pd), titanium (Ti), molybdenum (Mo), tantalum (Ta), tantalum nitride, and an alloy containing at least one of the above metals. In order to achieve superconductivity, a coupler circuit is used in a temperature environment of about 10 mK (millikelvin) achieved by a refrigerator.

Referring to FIG. 8, a planar shape of the first electrode 16 is an approximately trapezoidal and is of a shape with rotated about 45 degrees counterclockwise. The first and second opposing portions 17A and 17B of the first electrode 16 are extended (elongated), respectively, from vicinities of intersections between an upper side and oblique sides (legs) of the trapezoid toward a top and left sides in the drawing, i.e., toward locations where the JPO1 (20A) and JPO2 (20B) are disposed. A planar shape of the second electrode 18 is of a shape of an inverted trapezoid where a trapezoid is rotated clockwise by approximately 135 degrees. The third and fourth opposing portions 19A and 19B of the second electrode 18 are extended (elongated), respectively, from vicinities of intersections of an upper side and oblique sides (legs) of the trapezoid toward a bottom side and a right side in the drawing, i.e., toward locations where the JPO3 (20C) and JPO4 (20D) are disposed. The first electrode 16 and the second electrode 18 are arranged with respective bottom sides of the trapezoids facing each other, and a planar shape thereof, when aligned with the opposing portions 17A, 17B, 19A and 19B excluded, is almost hexagonal. A floating capacitance at one end of each of the opposing portions (17A, 17B, 19A and 19B) is not shown in FIG. 8.

The first electrode 16 has a protrusion 16C which protrudes downward in the drawing in a vicinity of an intersection of one end of a lower base and one of the oblique sides of the first electrode 16. The second electrode 18 has a cut portion 18C obtained by cutting off the second electrode 18 so as to be in parallel to the protrusion 16C of the first electrode 16 in a vicinity of an intersection of one end of the lower base and one of the oblique sides of the second electrode 18. A nonlinear element 10, such as a SQUID, is arranged in a gap between the protrusion 16C, which is located in a vicinity of an intersection of one end of the lower base and one of the oblique sides of the first electrode 16, and the cut portion 18C, which is located in a vicinity of an intersection of one end of the lower base and one of the oblique sides of the second electrode 18. The diagonally arranged configuration of the first electrode 16 and the second electrode 18 in the coupler 21 enables to make a placement area of the coupler 21 compact.

The JPO1 (20A) through JPO4 (20D) include coplanar waveguides (Coplanar Waveguides) 25A, 25B, 25C and 25D and SQUIDs 26A, 26B, 26C, and 26D, respectively. The JPO1 (20A) through JPO4 (20D) are LC resonant circuits in a microwave region which are composed by linear inductance components and capacitance components of the coplanar waveguides 25A, 25B, 25C and 25D and nonlinear inductance components of SQUIDs 26A, 26B, 26C, and 26D, respectively. By supplying DC current to each of control lines 23A, 23B, 23C, and 23D inductively coupled with the SQUIDs 26A, 26B, 26C, and 26D, a resonant frequency of each of the JPOs 20A, 20B, 20C, and 20D is enabled to be adjusted.

Connection portions (waveguides for I/O) 22A through 22D for connecting to readout circuits (not shown) are capacitively coupled via capacitors 32A through 32D with the JPO1 (20A) through JPO4 (20D), respectively. The capacitor 15 illustrated in FIG. 2 is omitted. In FIG. 8, the connection portions (coplanar waveguides for I/O) 22A, 22B, 22C, and 22D for connecting to the readout circuits, respectively, are shown in part. Each wiring pattern of the connection portions (coplanar waveguides for I/O) 22A through 22D may have a configuration extended to a chip periphery and, for example, connected to a wiring substrate (not shown) or the like via a bump electrode or the like. Each wiring pattern of the connection portions (coplanar waveguides for I/O) 22A through 22D may be connected to a measurement device or the like outside a refrigerator (not shown) via a readout line (cable) or the like.

The superconducting quantum circuit apparatus includes air bridge wirings (also called simply "air bridges") 27A, 27B, 27C, and 27D with respect to the control lines 23A, 23B, 23C, and 23D with the coplanar waveguide configuration. The air bridge wirings 27A, 27B, 27C, and 27D are overhead wiring over a wiring layer to stabilize ground potential surrounding the JPO1 (20A) through JPO4 (20D). The control lines 23A, 23B, 23C, and 23D have configurations that are connected to a wiring substrate (not shown) or the like via bump electrodes (not shown) or the like at a periphery of a chip or the like, for example, and are connected to a signal generation device (current control part) or the like outside the refrigerator.

Figure 9:
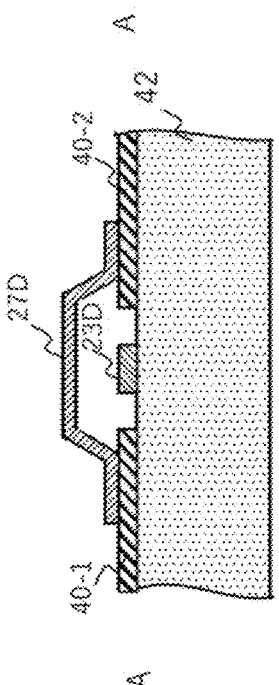
FIG. 9 is a diagram schematically illustrating a cross section of an A-A line in FIG. 8.

FIG. 9 schematically illustrates a cross sectional view along an A-A line orthogonal to the control line 23D in FIG. 8. The cross section for the control lines 23A through 23C is also configured in an identical manner. For example, a wiring layer is formed on a surface of a substrate 42 of silicon, on which the JPOs 20 (20A-20D), the coupler (21) in the center and the ground plane 40 are formed. The control line 23D is configured as a coplanar waveguide in the same wiring layer.

Ground planes (ground patterns) 40-1 and 40-2 are provided on both sides of the control line 23D (wiring) in a longitudinal direction, via gaps, respectively. The air bridge wiring 27D, which is made of a superconducting material (e.g., Al or the like), is formed in such a manner that strides over the control line 23D in an arch shape and connects the ground planes 40-1 and 40-2 on both sides of the control line 23D.

An air bridge wiring structure with respect to the ground plane 40 prevents the ground plane 40 from being divided into both sides by the control line 23 (23A through 23D) configured with the coplanar waveguide. This results in a uniform charge distribution on the ground plane 40 that surrounds the JPO1 (20A) through JPO4 (20D) and in a stabilization of a ground potential. As a non-limiting example, In FIG. 8, the connection portions (coplanar waveguides for I/O) 22A through 22D for connecting to readout circuits are provided with air bridge wirings 28A, 28B, 28C, and 28D, which are made an overhead wiring over the wiring layer, respectively, as well as the control lines 23A through 23D. The air bridge wirings 28A through 28D of the connection portions (coplanar waveguides for I/O) 22A through 22D also have the same cross-section configuration.

Furthermore, referring to FIG. 8, air bridge wirings 29A through 29D, which are made of superconducting materials (e.g., Al or the like) are provided to stride over the coupler connection portions 24A through 24D of the JPO1 (20A) through JPO4 (20D), respectively, and to connect the GND patterns on both sides.

In a case where the coupler 21 and a plurality of qubits are configured on a planar circuit, ground is divided at the qubit and coupling portions, which may induce an AC (alternate current)/a DC (direct current) crosstalk or the like via a slot-line mode, etc. However, by connecting ground planes using an air bridge wiring structure as illustrated in FIG. 8, a charge distribution on the ground planes on both sides of a signal conductor can be made uniform, enabling the above crosstalk, etc. to be avoided.

Letting $C_J$ denote a capacitance value of a capacitor between each of the coplanar waveguides 25A through 25D of the JPO1 (20A) through JPO4 (20D) and ground (206A through 206D in FIG. 2), $C_g$ denote a capacitance value of a capacitor (15 in FIG. 2) between the first and second electrodes 16 and 18 of the coupler 21, and C denote each of a capacitance value of a coupling capacitor (31A in FIG. 2) between the first opposing portion 17A of the coupler 21 and the coupler connection portion 24A of the coplanar waveguide 25A of the JPO1 (20A), a capacitance value of a coupling capacitor (31B in FIG. 2) between the second opposing portion 17B of the coupler 21 and the coupler connection portion 24B of the coplanar waveguide 25B of the JPO2 (20B), a capacitance value of a coupling capacitor (31C in FIG. 2) between the third opposing portion 19A of the coupler 21 and the coupler connection portion 24C of the coplanar waveguide 25C of the JPO3 (20C), and a capacitance value of a coupling capacitor (31D in FIG. 2) between the fourth opposing portion 19B of the coupler 21 and the coupler connection portion 24D of the coplanar waveguide 25D of the JPO4 (20D), the following magnitude relation may hold.

$$C_J > C_g > C.$$

By setting a resonance angular frequency $\omega$ of each of the JPO1 (20A) through the JPO4 (20D) closer to a resonance angular frequency of the coupler 21, the coupling strength of the four-body interaction can be set to be larger.

The first and second electrodes 16 and 18 of the coupler 21 are coupled via the capacitor 15. In addition, the first electrode 16 is coupled with the JPO1 (20A) and JPO2 (20B) via the coupling capacitors 31A and 31B, respectively, and the second electrode 18 is coupled with the JPO3 (20C) and JPO4 (20D) via the coupling capacitors 31C and 31D, respectively. Thus, the first and second electrodes 16 and 18 have planar structures, an entirety thereof enclosed by the ground plane 40. The first and second opposing portions 17A and 17B capacitively coupled with the JPO1 (20A) and JPO2 (20B), respectively, are extended (protruded) from the first electrode 16 toward the ground plane 40 and able to be coupled to each of the JPO1 (20A) and JPO2 (20B) at a point away from the first electrode 16. The third and fourth opposing portions 19A and 19B capacitively coupled with the JPO3 (20C) and JPO4 (20D), respectively, are extended (protruded) from the second electrode 18, toward the ground plane 40 and able to be coupled to each of the JPO3 (20C) and JPO4 (20D) at a point away from the second electrode 18.

The capacitor ($C_g$) 15 between the first and second electrodes 16 and 18 makes the coupler 21 robust against a disturbance(s) caused by a magnetic field noise, etc. The reduction of the capacitor 15 of the coupler 21 has an effect of strengthening a four-body interaction.

The coupling strength (coupling constant) of the four-body interaction will be lowered due to the floating capacitance (Cs) between the end of the coupler 21 and ground.

Regarding the first and second electrodes 16 and 18, a large gap, with no superconductor deposited, is provided for separation between the ground plane 40 and the first electrode 16 other than end portions of the first and second opposing portions 17A and 17B, and between the ground plane 40 and the second electrode 18 other than the third and fourth opposing portions 19A and 19B, for example, by an order of about 100 μm (micrometer) in length, thus reducing a floating capacitance between each of the first electrode 16 and the second electrode 18 and ground. The gap is of a size comparable to the coupler 21. The first and second opposing portions 17A and 17B of the first electrode 16 and the third and fourth opposing portions 19A and 19B of the second electrode 18, up to their open ends, are arranged within a region 41 (gap region) surrounded by the ground plane 40. This reduces a floating capacitances Cs/2 of each of the first opposing portion 17A, the second opposing portion 17B, the third opposing portion 19A and the fourth opposing portion 19B of the coupler 21. By reducing the floating capacitance Cs (FIG. 4) at each end of the coupler 21, the coefficient of the four-body interaction (coupling constant) g(4) can be made large.

Figure 10A:
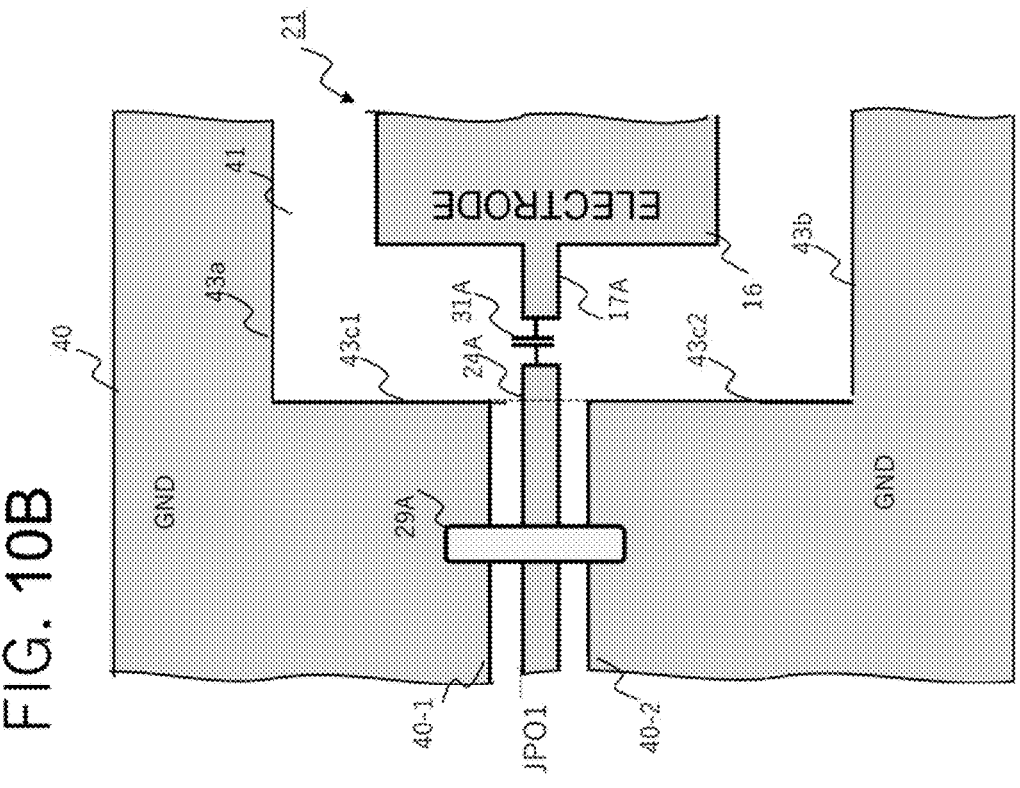
FIGS. 10A and 10B are diagrams each illustrating a variation of the example.
Figure 10B:
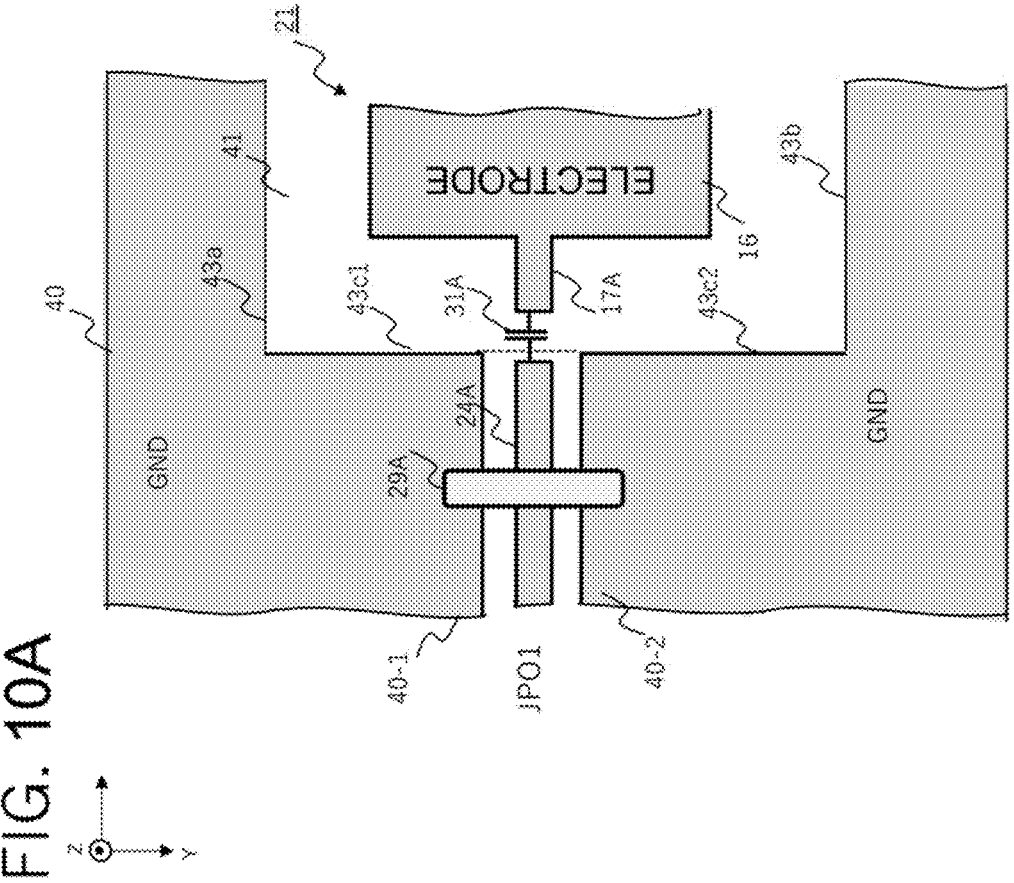

FIG. 10A and FIG. 10B schematically illustrate examples of air bridge wirings 29A through 29D, each of which is made of a superconducting material (e.g., Al or the like) and provided to stride over each of the coupler connection portions 24A through 24D of JPO1 (20A) through JPO4 (20D) and connect GND patterns on both sides. In FIG. 10A and FIG. 10B, only an example of an arrangement of the air bridge wiring 29A is illustrated, while air bridge wirings 29B through 29D are omitted simply for the sake of drawing convenience.

The example in FIG. 10A illustrates a configuration in which a coupler connection portion 24A of the JPO1 (20A) (qubit) does not protrude into a region 41 defined by a ground plane 40. In this example, an end of the coupler connection portion 24A is located to a left of a boundary (broken line) defined by an edge 43c1 and an edge 43c2. The JPO2 (20B) through JPO4 (20D) also have the same configuration.

As for each of the air bridges 29A through 29D, a distance by which each of the air bridges 29A through 29D is spaced from the each of the coupling capacitors 31A through 31D is suffices to be greater as compared with a length of a gap in each of the coupling capacitors 31A through 31D, where the distance is equivalent to a distance from an each end of the coupler connection portions 24A through 24D to each of the air bridge wirings 29A through 29D, and the gap is each one of a gap between the ends of the coupler connection portion 24A and the first opposing portion 17A of the first electrode 16, a gap between the ends of the coupler connection portion 24B and the second opposing portion 17B of the first electrode 16, a gap between the ends of the coupler connection portion 24C and the third opposing portion 19A of the second electrode 18, and a gap between the ends of the coupler connection portion 24D and the fourth opposing portion 19B of the second electrode 18.

This structure reduces a floating capacitance $C_s$ between each end of the coupler 21 and ground. As a result, with respect to a capacitance obtained by adding a coupling capacitance C and $C_s/2$ to a capacitance $C_g$ of the coupler 21, a contribution ratio of the capacitances $C_g+C$, which contributes to a four-body interaction coupling, increases, and coupling of quantum states among the JPOs (qubits) becomes greater. Furthermore, the air bridge wirings 29A through 29D connect a ground plane 40 surrounding the coupler 21 to strengthen noise resilience.

The example in FIG. 10B illustrates a configuration in which the coupler connection portion 24A of the JPO1 (20A) protrudes into the region 41. That is, an end portion of the coupler connection portion 24A is disposed in the region 41 beyond the boundary (broken line) defined by an edge 43c1 and an edge 43c2. The JPO2 (20B) through JPO4 (20D) also have the same configuration. The configuration in FIG. 10B allows increasing a gap between first and second electrodes 16 and 18 of a coupler 21 and ground, thereby decreasing the floating capacitance between the coupler 21 and ground, while maintaining a magnitude of a capacitance value of each of the coupling capacitors 31A through 31D between the JPO1 (20A) through JPO4 (20D) and each of the opposing portion (17A, 17B, 19A and 19B) of the coupler 21. In FIG. 10B, the air bridge wiring 29A is disposed in the similar manner as FIG. 10A. Since the end portion of the coupler connection portion 24A of the JPO1

(20A) extends beyond the boundary (broken line) to protrude into the region 41, the air bridge wiring 29A may be placed closer to the boundary (broken line).

Figure 11A:
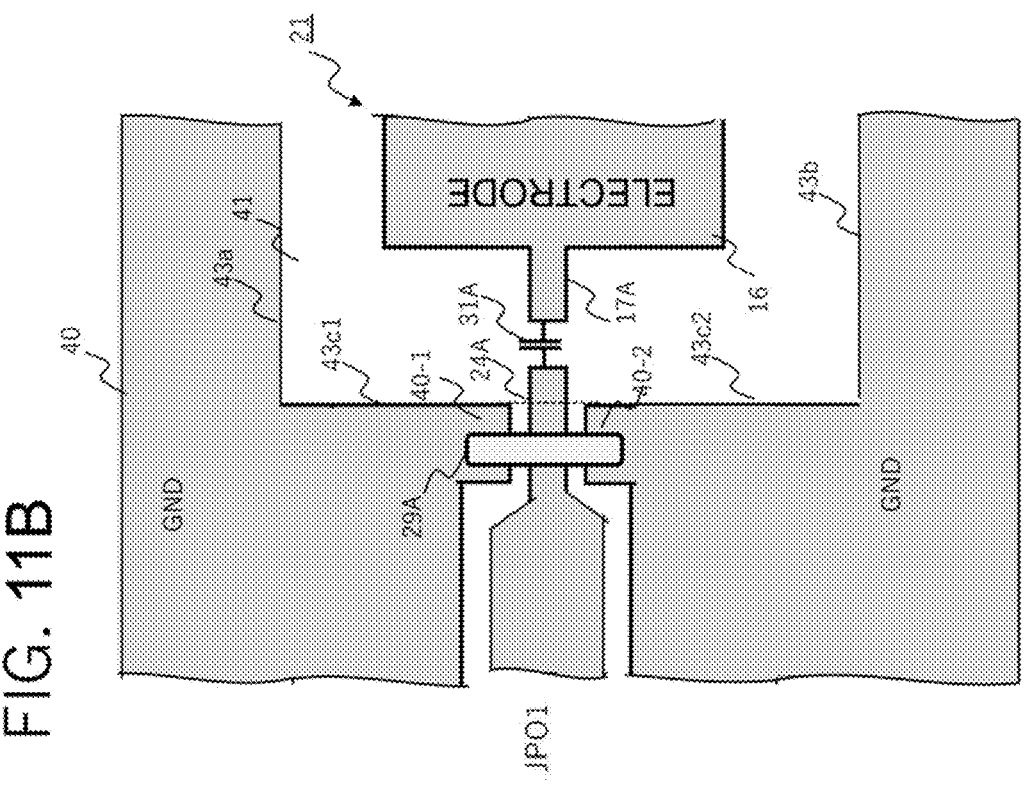
FIGS. 11A and 11B are each diagrams illustrating a variation of the example embodiment.
Figure 11B:
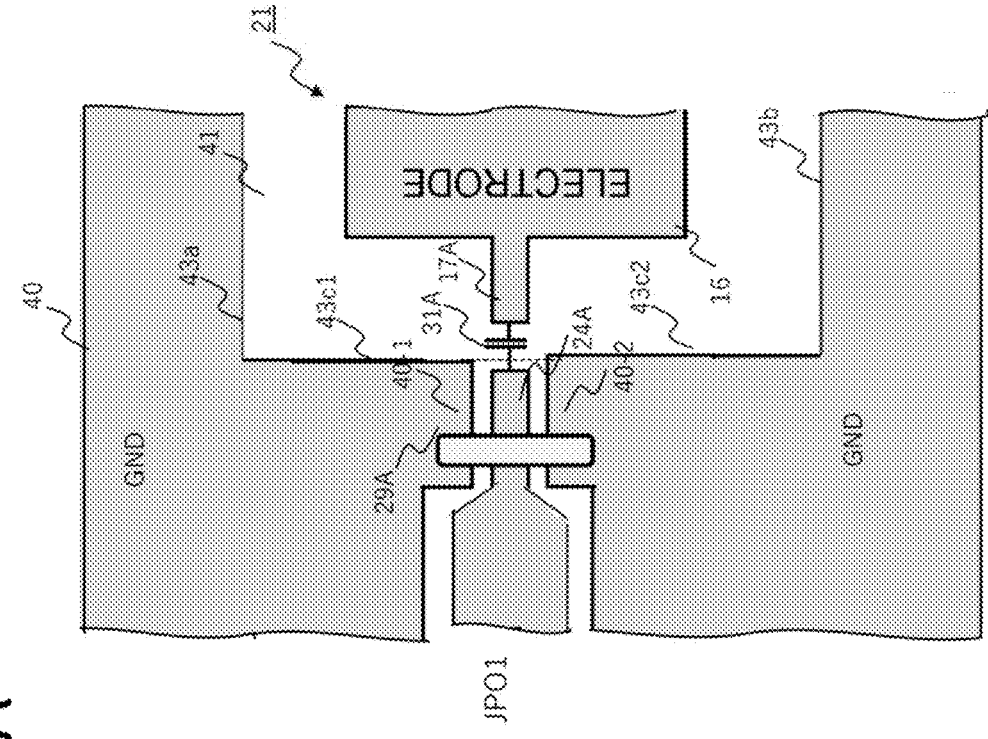

FIG. 11A and FIG. 11B illustrate variations of the configurations illustrated in FIG. 10A and FIG. 10B, respectively. FIG. 11A corresponds to a configuration in which a coupler connection portion 24A of the JPO1 (20A) does not protrude into a region 41. FIG. 11B corresponds to a configuration in which the coupler connection portion 24A of the JPO1 (20A) protrudes into the region 41. In general, the longer the air bridge wiring structure, the more likely it is that the air bridge itself be damaged. The damage includes collapsing under its own weight etc., which causes the air bridge wiring and signal a signal conducting line come into contact. According to the configuration illustrated in FIG. 11A, the coupler connection portion 24A of the JPO1 (20A) has a narrow line width from an open end to an installation site of an air bridge wiring 29A, and after passing the air bridge wiring 29A, the line width becomes wide via a tapered portion. The coupler connection portion 24A of the JPO1 (20A) connects to a first superconducting portion 203A of a SQUID loop 210A of the JPO1.

Figure 12:
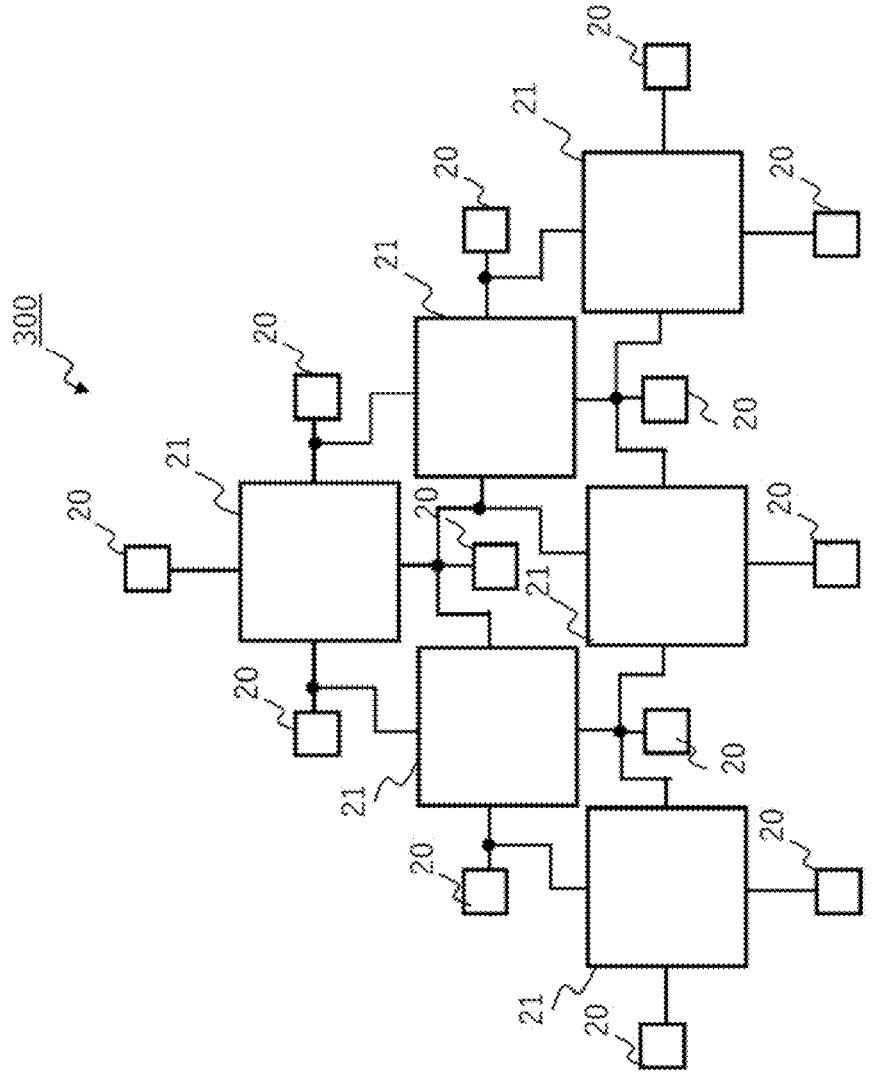
FIG. 12 is a diagram schematically illustrating another example embodiment.

FIG. 12 is a schematic diagram of the configuration of a quantum computer 300 on which JPOs 20 according the above-described embodiment are integrated. In the configuration illustrated in FIG. 12, each four-body interaction coupler 21 is connected to the four JPOs 20, respectively, as illustrated in FIG. 2 through FIG. 4. Each JPO 20 is connected to one through four four-body interaction coupler(s) 21, and the JPO 20 is arranged to be shared by a plurality of unit structures to provide a configuration in which a plurality of unit structures illustrated in FIG. 2 through FIG. 4 are arranged. In the quantum computer 300, at least one JPO 20 is connected to a plurality of four-body interaction couplers 21. In the example as illustrated in FIG. 12, at least one JPO 20 is connected to four four-body interaction couplers 21. The quantum computer 300 can also be described as follows. The quantum computer 300 includes a plurality of JPOs 20, each of which is connected to one through four four-body interaction couplers 21. The number of the four-body interaction couplers 21 to which each JPO 20 connects corresponds to how many unit structures share the JPOs 20. Thus, in the example illustrated in FIG. 12, the quantum computer 300 includes a plurality of unit structures, and a plurality of unit structures share the JPO 20. In the example illustrated in FIG. 12, 13 superconducting nonlinear JPOs 20 are integrated, but any number of JPOs 20 may be integrated in a similar manner. A current control part and a readout part are not illustrated in FIG. 12. The configuration illustrated in FIG. 12 is suited for a network using Lechner-Hauke-Zoller (LHZ) scheme, which is one of a quantum annealing schemes.

The disclosure of each of PTL 1 and NPL 1 is incorporated herein by reference thereto. Variations and adjustments of the Exemplary embodiments and examples are possible within the scope of the overall disclosure (including the claims) of the present invention and based on the basic technical concept of the present invention. Various combinations and selections of various disclosed elements (including the elements in each of the claims, examples, drawings, etc.) are possible within the scope of the claims of the present invention. Namely, the present invention of course includes various variations and modifications that could be made by those skilled in the art according to the overall disclosure including the claims and the technical concept.

What is claimed is:

1. A superconducting quantum circuit apparatus comprising:

first through fourth qubits; and a coupler arranged in a region surrounded by a ground plane, the coupler disposed spaced apart from the ground plane, wherein the coupler includes:

a first electrode and a second electrode arranged opposed to each other; and a nonlinear element including at least one Josephson junction bridged between the first electrode and the second electrode, the first electrode including first and second opposing portions extended toward the first and second qubits, respectively, ends of the first and second opposing portions being opposed to ends of coupler connection portions of the first and second qubits, for capacitive coupling therewith, respectively, the second electrode including third and fourth opposing portions extended toward third and fourth qubit, respectively, ends of the third and fourth opposing portions being opposed to ends of coupler connection portions of the third and fourth qubits, for capacitive coupling therewith, respectively, wherein the ends of the first and second opposing portions and the ends of the third and fourth opposing portions are disposed within the region surrounded by the ground plane, wherein the first through fourth qubits each include a resonator including:

a loop circuit including a first superconducting line; a first Josephson junction; a second superconducting line; and a second Josephson junction connected in a loop, and a capacitor connected in parallel to the loop circuit.

2. The superconducting quantum circuit apparatus according to claim 1, wherein the coupler connection portions of the first and second qubits have parts along respective longitudinal directions, inclusive of the ends thereof, protruding into the region surrounded by the ground plane, and the coupler connection portions of the third and fourth qubits have parts along respective longitudinal directions, inclusive of the ends thereof, protruding into the region surrounded by the ground plane.

3. The superconducting quantum circuit apparatus according to claim 1, comprising:

the ground plane provided, via a gap, on each of both sides of the coupler connection portions of each one of the first through fourth qubits, along a longitudinal direction thereof; and an air bridge striding over at least one coupler connection portion among the coupler connection portions of the first through fourth qubits to connect the ground plane on the both sides of the at least one coupler connection portion.

4. The superconducting quantum circuit apparatus according to claim 1, wherein the first and second electrodes of the coupler each include an edge spaced apart from an opposing edge of the ground plane surrounding the region by a distance equivalent of an order of a size of each of the first and second electrodes.

5. The superconducting quantum circuit apparatus according to claim 4, wherein the distance is in a range from one fifth to five times the size of each of the first and second electrodes.

6. The superconducting quantum circuit apparatus according to claim 1, wherein the coupler connection portions of the first and second qubits have the ends thereof, located at a position on a boundary or not reaching but close to the boundary, of the region surrounded by the ground plane, and the coupler connection portions of the third and fourth qubits have the ends located at a position on a boundary or not reaching but close the boundary, of the region surrounded by the ground plane.

7. The superconducting quantum circuit apparatus according to claim 1, wherein, in each of the first through fourth qubits, the second superconducting line of the loop circuit is connected to ground, the first superconducting line of the loop circuit is connected to a first end of the coupler connection portion, the coupler connection portions of the first and second qubits have second ends for capacitively coupling with the ends of the first and second opposing portions of the coupler, respectively, and the coupler connection portions of the third and fourth qubits have second ends for capacitively coupling with the ends of the third and fourth opposing portions of the coupler, respectively.

8. The superconducting quantum circuit apparatus according to claim 1, wherein the nonlinear element of the coupler includes a loop circuit including;

first and second superconducting lines configuring a loop; and a first Josephson junctions connecting one ends of the first and second superconducting lines; and a second Josephson junctions connecting other ends of the first and second superconducting lines.

9. The superconducting quantum circuit apparatus according to claim 1, wherein a strength of four-body interaction includes a term $C_g + C + C_s/2$, where C is a capacitance value of a capacitive coupling between the coupler and each of the first through fourth qubits, $C_g$ is a capacitance value between the first and second electrodes of the coupler, and Cs is a floating capacitance value between ground and each of the first and second electrodes of the coupler, wherein contribution of $C_s$ to the strength of four-body interaction is reduced with reduction of $C_s$.

10. The superconducting quantum circuit apparatus according to claim 1, wherein the first through fourth qubits are configured as Josephson parametric oscillators and the coupler constitute a unit structure in a quantum computer.

11. The superconducting quantum circuit apparatus according to claim 10, comprising:

a plurality of the unit structures, wherein the quantum computer is configured such that at least one qubit among the first through fourth qubits included in one unit structure is shared by one or a plurality of other unit structures.

12. A superconducting quantum circuit apparatus comprising:

first through fourth qubits; and a coupler arranged in a region surrounded by a ground plane, the coupler disposed spaced apart from the ground plane, wherein the coupler includes:

a first electrode and a second electrode arranged opposed to each other; and a nonlinear element including at least one Josephson junction bridged between the first electrode and the second electrode, the first electrode including first and second opposing portions extended toward the first and second qubits, respectively, ends of the first and second opposing portions being opposed to ends of coupler connection portions of the first and second qubits, for capacitive coupling therewith, respectively, the second electrode including third and fourth opposing portions extended toward third and fourth qubit, respectively, ends of the third and fourth opposing portions being opposed to ends of coupler connection portions of the third and fourth qubits, for capacitive coupling therewith, respectively, wherein the ends of the first and second opposing portions and the ends of the third and fourth opposing portions are disposed within the region surrounded by the ground plane, wherein at least one coupler connection portion among the coupler connection portions of the first through fourth qubits includes a first section including the end and a second section contiguous with the first section along a longitudinal direction of the coupler connection portion, the first section having a first width, the second section having a second width that expands from the first width to be more than the first width, the first section of the coupler connection portion is provided with the ground plane on each of both sides thereof, via a gap, wherein the superconducting quantum circuit apparatus includes an air bridge wiring striding over the first section of the coupler connection portion to connect the ground plane on the both sides thereof.

\* \* \* \* \*